(12) United States Patent
Ohwada et al.

(10) Patent No.: US 12,278,317 B2
(45) Date of Patent: Apr. 15, 2025

(54) TRANSPARENT SEALING MEMBER AND OPTICAL COMPONENT

(71) Applicant: NGK INSULATORS, LTD., Nagoya (JP)

(72) Inventors: Iwao Ohwada, Nagoya (JP); Yoshio Kikuchi, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 1038 days.

(21) Appl. No.: 17/215,306

(22) Filed: Mar. 29, 2021

(65) Prior Publication Data

US 2021/0217938 A1 Jul. 15, 2021

Related U.S. Application Data

(63) Continuation of application No. PCT/JP2019/039936, filed on Oct. 10, 2019.

(30) Foreign Application Priority Data

Oct. 10, 2018 (JP) .................................. 2018-192162
Nov. 12, 2018 (JP) .................................. 2018-212467

(51) Int. Cl.
*H01L 33/58* (2010.01)
*G02B 19/00* (2006.01)

(52) U.S. Cl.
CPC .......... *H01L 33/58* (2013.01); *G02B 19/0028* (2013.01); *G02B 19/0061* (2013.01)

(58) Field of Classification Search
CPC .. H01L 33/58; G02B 19/0061; G02B 19/0028
See application file for complete search history.

(56) References Cited

U.S. PATENT DOCUMENTS 7,145,290 B2 * 12/2006 Kang .................. H10K 59/8722
  313/506
7,411,742 B1 * 8/2008 Kim ......................... G02B 3/02
  369/112.01

(Continued)

FOREIGN PATENT DOCUMENTS

JP   2008-147205 A1   6/2008
JP   2013-187245 A1   9/2013

(Continued)

OTHER PUBLICATIONS

English translation of the International Preliminary Report on Patentability (Chapter I)(Application No. PCT/JP2019/039936) dated Apr. 22, 2021.

(Continued)

*Primary Examiner* — Evan P Dzierzynski
*Assistant Examiner* — Nathaniel J Lee
(74) *Attorney, Agent, or Firm* — BURR PATENT LAW, PLLC

(57) ABSTRACT

The present invention relates to a transparent sealing member and an optical component. The present invention is a transparent sealing member (10A) used in an optical component (100A) provided with a package (16A) having at least one optical element (14) emitting ultraviolet light (12) and a mount board (18) to which the optical element is mounted. The transparent sealing member (10A) is provided with a transparent body (24) joined on the mount board (18) via an organic adhesion layer (20), and the transparent body (24) has a housing space (26) in a lower surface opening.

8 Claims, 21 Drawing Sheets

(56) References Cited

U.S. PATENT DOCUMENTS

2013/0314925 A1\* 11/2013 Jiang ..................... F21V 7/0091
          362/311.02
2017/0338388 A1\* 11/2017 Wu ....................... H01L 33/486

FOREIGN PATENT DOCUMENTS

| JP | 2014-066837 A1 | 4/2014 |
| JP | 2017-147406 A1 | 8/2017 |

OTHER PUBLICATIONS

International Search Report and Written Opinion (Application No. PCT/JP2019/039936) dated Nov. 26, 2019.

\* cited by examiner

FIG. 10

[TABLE 1]

| | EXEMPLARY EMBODIMENT 1 | EXEMPLARY EMBODIMENT 2 | EXEMPLARY EMBODIMENT 3 | EXEMPLARY EMBODIMENT 4 | COMPARATIVE EXAMPLE |
|---|---|---|---|---|---|
| SHAPE OF LENS BODY | LOW LENS | TALL LENS | HEMISPHERICAL LENS | FLAT PLATE | FLAT PLATE |
| SHAPE OF ACCOMMODATING SPACE | QUADRANGULAR | HEMISPHERICAL DOME | HEMISPHERICAL DOME | QUADRANGULAR | NONE |
| PACKAGE CONFIGURATION | | | | | |
| LIGHT DISTRIBUTION | | | | | |
| LIGHT DISTRIBUTION ANGLE | 77° | 25° | 130° | 122° | 108° |
| LIGHT EXTRACTION EFFICIENCY | 93% | 93% | 93% | 91% | 75% |
| LUMINOSITY AT JOINED PORTION | 5 | 9 | 5 | 87 | 100 |

COMPARATIVE EXAMPLE

EXEMPLARY EMBODIMENT 3

EXEMPLARY EMBODIMENT 4

FIG. 12

[TABLE 2]

| | EXEMPLARY EMBODIMENT 5 | EXEMPLARY EMBODIMENT 6 | EXEMPLARY EMBODIMENT 7 | EXEMPLARY EMBODIMENT 8 | EXEMPLARY EMBODIMENT 9 |
|---|---|---|---|---|---|
| SHAPE OF LENS BODY | INVERTED TRAPEZOID | FLAT PLATE | FLAT PLATE | INVERTED TRAPEZOID | FLAT PLATE |
| SHAPE OF ACCOMMODATING SPACE | QUADRANGULAR | DOWNWARD CONVEX | OUTER PERIPHERAL GROOVE | DOWNWARD CONVEX | DOWNWARD CONVEX + OUTER PERIPHERAL GROOVE |
| PACKAGE CONFIGURATION | | | | | |
| LIGHT DISTRIBUTION | | | | | |
| LIGHT DISTRIBUTION ANGLE | 124° | 102° | 124° | 106° | 106° |
| LIGHT EXTRACTION EFFICIENCY | 92% | 91% | 93% | 93% | 93% |
| LUMINOSITY AT JOINED PORTION | 36 | 64 | 61 | 18 | 21 |

FIG. 13

[TABLE 3]

| | EXEMPLARY EMBODIMENT 1 | EXEMPLARY EMBODIMENT 2 | EXEMPLARY EMBODIMENT 3 |
|---|---|---|---|
| SHAPE OF LENS BODY | LOW LENS | TALL LENS | HEMISPHERICAL LENS |
| LENS DIAMETER (Lm) | 3.2mmΦ | 3.2mmΦ | 3.2mmΦ |
| LENS HEIGHT (hm) | 1.0mm | 2.5mm | 1.1mm |
| hm/Lm | 0.31 | 0.78 | 0.34 |
| PEDESTAL HEIGHT (hl) | 0.5mm | 0.5mm | 0.5mm |
| PEDESTAL OUTER DIAMETER (Da) | 3.5mmSq. | 3.5mmSq. | 3.5mmSq. |
| MEMBER HEIGHT (hc) | 1.5mm | 3.0mm | 1.6mm |
| SHAPE OF ACCOMMODATING SPACE | QUADRANGULAR | HEMISPHERICAL DOME | HEMISPHERICAL DOME |
| ACCOMMODATING SPACE OUTER DIAMETER | 2.0mmSq. | 2.4mmΦ | 2.4mmΦ |
| ACCOMMODATING SPACE HEIGHT (hk) | 0.5mm | 1.2mm | 1.2mm |
| EXPRESSION (1) H | 1.0 | 14.4 | 0.10 |
| LIGHT DISTRIBUTION ANGLE | 77° | 25° | 130° |
| LIGHT EXTRACTION EFFICIENCY | 93% | 93% | 93% |
| LUMINOSITY AT JOINED PORTION | 5 | 9 | 5 |

FIG. 14

[TABLE 4]

| | EXEMPLARY EMBODIMENT 10 | EXEMPLARY EMBODIMENT 11 | EXEMPLARY EMBODIMENT 12 | EXEMPLARY EMBODIMENT 13 |
|---|---|---|---|---|
| SHAPE OF LENS BODY | LOW LENS | LOW LENS | LOW LENS | HEMISPHERICAL LENS |
| LENS DIAMETER (Lm) | 3.2mmΦ | 3.2mmΦ | 3.2mmΦ | 3.2mmΦ |
| LENS HEIGHT (hm) | 0.7mm | 1.3mm | 1.5mm | 1.6mm |
| hm/Lm | 0.22 | 0.41 | 0.47 | 0.50 |
| PEDESTAL HEIGHT (hl) | 0.5mm | 0.5mm | 0.5mm | 0.5mm |
| PEDESTAL OUTER DIAMETER (Da) | 3.5mmSq. | 3.5mmSq. | 3.5mmSq. | 3.5mmSq. |
| MEMBER HEIGHT (hc) | 1.2mm | 1.8mm | 2.0mm | 2.1mm |
| SHAPE OF ACCOMMODATING SPACE | QUADRANGULAR | QUADRANGULAR | QUADRANGULAR | QUADRANGULAR |
| ACCOMMODATING SPACE OUTER DIAMETER | 2.0mmSq. | 2.0mmSq. | 2.0mmSq. | 2.1mmSq. |
| ACCOMMODATING SPACE HEIGHT (hk) | 0.5mm | 0.5mm | 0.5mm | 0.5mm |
| EXPRESSION (1) H | 0.3 | 2.2 | 3.4 | 4.1 |
| LIGHT DISTRIBUTION ANGLE | 96° | 71° | 63° | 59° |
| LIGHT EXTRACTION EFFICIENCY | 92% | 93% | 93% | 93% |
| LUMINOSITY AT JOINED PORTION | 8 | 5 | 11 | 16 |

FIG. 15

[TABLE 5]

| | EXEMPLARY EMBODIMENT 14 | EXEMPLARY EMBODIMENT 15 | EXEMPLARY EMBODIMENT 16 | EXEMPLARY EMBODIMENT 17 |
|---|---|---|---|---|
| SHAPE OF LENS BODY | TALL LENS | TALL LENS | TALL LENS | TALL LENS |
| LENS DIAMETER (Lm) | 3.2mmΦ | 3.2mmΦ | 3.2mmΦ | 3.2mmΦ |
| LENS HEIGHT (hm) | 1.8mm | 2.0mm | 2.2mm | 2.5mm |
| hm/Lm | 0.56 | 0.63 | 0.69 | 0.78 |
| PEDESTAL HEIGHT (hl) | 0.5mm | 0.5mm | 0.5mm | 0.5mm |
| PEDESTAL OUTER DIAMETER (Da) | 3.5mmSq. | 3.5mmSq. | 3.5mmSq. | 3.5mmSq. |
| MEMBER HEIGHT (hc) | 2.3mm | 2.5mm | 2.7mm | 3.0mm |
| SHAPE OF ACCOMMODATING SPACE | QUADRANGULAR | QUADRANGULAR | QUADRANGULAR | QUADRANGULAR |
| ACCOMMODATING SPACE OUTER DIAMETER | 2.0mmSq. | 2.0mmSq. | 2.0mmSq. | 2.0mmSq. |
| ACCOMMODATING SPACE HEIGHT (hk) | 0.5mm | 0.5mm | 0.5mm | 0.5mm |
| EXPRESSION (1) H | 5.8 | 8.0 | 10.6 | 15.6 |
| LIGHT DISTRIBUTION ANGLE | 51° | 43° | 37° | 33° |
| LIGHT EXTRACTION EFFICIENCY | 92% | 92% | 91% | 89% |
| LUMINOSITY AT JOINED PORTION | 24 | 27 | 18 | 10 |

FIG. 16

[TABLE 6]

| | EXEMPLARY EMBODIMENT 18 | EXEMPLARY EMBODIMENT 19 | EXEMPLARY EMBODIMENT 20 |
|---|---|---|---|
| SHAPE OF LENS BODY | LOW LENS | LOW LENS | HEMISPHERICAL LENS |
| LENS DIAMETER (Lm) | 3.2mmΦ | 3.2mmΦ | 3.2mmΦ |
| LENS HEIGHT (hm) | 1.3mm | 1.3mm | 1.6mm |
| hm/Lm | 0.41 | 0.41 | 0.50 |
| PEDESTAL HEIGHT (hl) | 0.3mm | 0.5mm | 0.5mm |
| PEDESTAL OUTER DIAMETER (Da) | 3.5mmSq. | 3.5mmSq. | 3.5mmSq. |
| MEMBER HEIGHT (hc) | 1.6mm | 1.8mm | 2.1mm |
| SHAPE OF ACCOMMODATING SPACE | HEMISPHERICAL DOME | HEMISPHERICAL DOME | TALL DOME |
| ACCOMMODATING SPACE OUTER DIAMETER | 2.4mmΦ | 2.4mmΦ | 2.4mmΦ |
| ACCOMMODATING SPACE HEIGHT (hk) | 1.2mm | 1.2mm | 1.5mm |
| EXPRESSION (1) H | 0.8 | 1.0 | 1.2 |
| LIGHT DISTRIBUTION ANGLE | 146° | 130° | 132° |
| LIGHT EXTRACTION EFFICIENCY | 94% | 94% | 95% |
| LUMINOSITY AT JOINED PORTION | 0.1 | 0.5 | 2 |

FIG. 17

[TABLE 7]

| | EXEMPLARY EMBODIMENT 21 | EXEMPLARY EMBODIMENT 22 | EXEMPLARY EMBODIMENT 23 |
|---|---|---|---|
| SHAPE OF LENS BODY | HEMISPHERICAL LENS | TALL LENS | TALL LENS |
| LENS DIAMETER (Lm) | 3.2mmΦ | 3.2mmΦ | 3.2mmΦ |
| LENS HEIGHT (hm) | 1.6mm | 1.8mm | 1.9mm |
| hm/Lm | 0.50 | 0.56 | 0.59 |
| PEDESTAL HEIGHT (h1) | 0.3mm | 0.5mm | 0.5mm |
| PEDESTAL OUTER DIAMETER (Da) | 3.5mmSq. | 3.5mmSq. | 3.5mmSq. |
| MEMBER HEIGHT (hc) | 1.9mm | 2.3mm | 2.4mm |
| SHAPE OF ACCOMMODATING SPACE | HEMISPHERICAL DOME | HEMISPHERICAL DOME | HEMISPHERICAL DOME |
| ACCOMMODATING SPACE OUTER DIAMETER | 2.4mmΦ | 2.4mmΦ | 2.4mmΦ |
| ACCOMMODATING SPACE HEIGHT (hk) | 1.2mm | 1.2mm | 1.2mm |
| EXPRESSION (1) H | 2.7 | 4.6 | 5.6 |
| LIGHT DISTRIBUTION ANGLE | 110° | 94° | 73° |
| LIGHT EXTRACTION EFFICIENCY | 95% | 94% | 93% |
| LUMINOSITY AT JOINED PORTION | 3 | 8 | 18 |

FIG. 18

[TABLE 8]

| | EXEMPLARY EMBODIMENT 24 | EXEMPLARY EMBODIMENT 25 | EXEMPLARY EMBODIMENT 26 |
|---|---|---|---|
| SHAPE OF LENS BODY | TALL LENS | TALL LENS | TALL LENS |
| LENS DIAMETER (Lm) | 3.2mmΦ | 3.2mmΦ | 3.2mmΦ |
| LENS HEIGHT (hm) | 2.0mm | 2.0mm | 2.2mm |
| hm/Lm | 0.63 | 0.63 | 0.69 |
| PEDESTAL HEIGHT (hl) | 0.5mm | 0.5mm | 0.5mm |
| PEDESTAL OUTER DIAMETER (Da) | 3.5mmSq. | 3.5mmSq. | 3.5mmSq. |
| MEMBER HEIGHT (hc) | 2.5mm | 2.5mm | 2.7mm |
| SHAPE OF ACCOMMODATING SPACE | HEMISPHERICAL DOME | LOW DOME | HEMISPHERICAL DOME |
| ACCOMMODATING SPACE OUTER DIAMETER | 2.4mmΦ | 2.4mmΦ | 2.4mmΦ |
| ACCOMMODATING SPACE HEIGHT (hk) | 1.2mm | 0.9mm | 1.2mm |
| EXPRESSION (1) H | 6.8 | 7.8 | 9.4 |
| LIGHT DISTRIBUTION ANGLE | 53° | 49° | 35° |
| LIGHT EXTRACTION EFFICIENCY | 93% | 93% | 93% |
| LUMINOSITY AT JOINED PORTION | 20 | 24 | 14 |

TRANSPARENT SEALING MEMBER AND OPTICAL COMPONENT

CROSS-REFERENCE TO RELATED APPLICATIONS

This application is a Continuation of International Application No. PCT/JP2019/039936 filed on Oct. 10, 2019, which is based upon and claims the benefit of priority from Japanese Patent Applications No. 2018-192162 filed on Oct. 10, 2018 and No. 2018-212467 filed on Nov. 12, 2018, the contents all of which are incorporated herein by reference.

TECHNICAL FIELD

The present invention relates to a transparent sealing member that is used in an optical component, and for example, relates to a transparent sealing member and an optical component that are suitable for use with an LED (light emitting diode), an LD (semiconductor laser), or the like.

BACKGROUND ART

Conventionally, an optical component 200, for example, as shown in FIG. 21A, includes a package 102, and an optical element 104 (for example, an LED, an LD, or the like) mounted inside the package 102. The package 102 includes, for example, a ceramic mounting substrate 108 on which a concave portion 106 that is open at the top is formed, and a flat plate-shaped lid member 110 which is joined, for example, to an upper end surface of the mounting substrate 108. The optical element 104 is mounted on a bottom part of the concave portion 106 of the mounting substrate 108. For joining the mounting substrate 108 and the lid member 110, for example, an organic adhesive layer 112 is used (see Japanese Laid-Open Patent Publication No. 2013-187245).

SUMMARY OF INVENTION

Incidentally, as shown in FIG. 21B, due to a relationship of the light distribution angle, in ultraviolet light 114 from the optical element 104, in addition to a light component emitted in a forward direction toward the lid member 110, there exists a light component emitted toward the aforementioned joined portion. In particular, the latter one of these light components is guided in a peripheral portion of the lid member 110, and impinges on the adhesive layer 112 of the joined portion. The organic adhesive layer 112 deteriorates due to the ultraviolet light 114 (for example, UV-C) from the optical element 104 impinging on the organic adhesive layer 112. This condition also leads to a deterioration in the durability of the package 102 (deterioration of the optical component 200).

As a solution to such problems, it may be attempted to utilize an adhesive in which a mixture of silicone resin and a fluoropolymer is used as the organic adhesive layer 112. However, since an adhesive containing such a specialized mixture is expensive, there is a problem that manufacturing costs are increased.

Apart therefrom, it may be considered to use a metallic bonding layer such as solder or the like for joining with the lid member 110. However, in this case, a problem arises in that the manufacturing process becomes complicated, in addition to being disadvantageous in terms of cost.

The present invention has been devised taking into consideration the aforementioned problems, and has the object of providing a transparent sealing member and an optical component, in which it is possible to avoid a situation in which ultraviolet light is irradiated onto the organic adhesive layer, and to enable an improvement in the durability of the package while using an inexpensive organic adhesive, as well as enabling an improvement in light extraction efficiency.

A first aspect of the present invention is characterized by a transparent sealing member used in an optical component equipped with a package including at least one optical element configured to emit ultraviolet light, and a mounting substrate on which the optical element is mounted, the transparent sealing member comprising a transparent body joined via an organic adhesive layer formed on an upper surface of the mounting substrate, wherein the transparent body includes a concave portion which is open at a bottom thereof.

According to the transparent sealing member of the above-described aspect, it is possible to avoid a situation in which the ultraviolet light is irradiated onto the organic adhesive, and to enable an improvement in the durability of the package while using an inexpensive organic adhesive, as well as enabling an improvement in light extraction efficiency.

A second aspect of the present invention is characterized by an optical component comprising: at least one optical element configured to emit ultraviolet light; and a package in which the optical element is accommodated, wherein the optical component includes: a mounting substrate on which the optical element is mounted; and a transparent body joined via an organic adhesive layer formed on an upper surface of the mounting substrate, the transparent body including a concave portion which is open at a bottom thereof.

In accordance with such a configuration, it is possible to avoid a situation in which the ultraviolet light is irradiated onto the organic adhesive, and to enable an improvement in the durability of the package while using an inexpensive organic adhesive, as well as enabling an improvement in light extraction efficiency.

BRIEF DESCRIPTION OF DRAWINGS

FIG. 10 is a Table 1 showing a light distribution and a light distribution angle, a light extraction efficiency, and a luminosity at each of joined portions, in relation to Exemplary Embodiments 1, 2, 3 and 4 and a Comparative Example;

FIG. 12 is a Table 2 showing a light distribution and a light distribution angle, a light extraction efficiency, and a luminosity at each of joined portions, in relation to Exemplary Embodiments 5, 6, 7 and 9;

FIG. 13 is a Table 3 showing various types of data concerned with shapes, a parameter H, a light distribution angle, a light extraction efficiency, and a luminosity at each of joined portions, in relation to Exemplary Embodiments 1, 2, and 3;

FIG. 14 is a Table 4 showing various types of data concerned with shapes, and a parameter H, a light distribution angle, a light extraction efficiency, and a luminosity at each of joined portions, in relation to Exemplary Embodiments 10, 11, 12, and 13;

FIG. 15 is a Table 5 showing various types of data concerned with shapes, a parameter H, a light distribution angle, a light extraction efficiency, and a luminosity at each of joined portions, in relation to Exemplary Embodiments 14, 15, 16, and 17;

FIG. 16 is a Table 6 showing various types of data concerned with shapes, a parameter H, a light distribution angle, a light extraction efficiency, and a luminosity at each of joined portions, in relation to Exemplary Embodiments 18, 19, and 20;

FIG. 17 is a Table 7 showing various types of data concerned with shapes, a parameter H, a light distribution angle, a light extraction efficiency, and a luminosity at each of joined portions, in relation to Exemplary Embodiments 21, 22, and 23;

FIG. 18 is a Table 8 showing various types of data concerned with shapes, a parameter H, a light distribution angle, a light extraction efficiency, and a luminosity at each of joined portions, in relation to Exemplary Embodiments 24, 25, and 26;

DESCRIPTION OF EMBODIMENTS

Exemplary embodiments of a transparent sealing member and an optical component according to the present invention will be described below with reference to FIGS. 1A to 20.

Figure 1A:
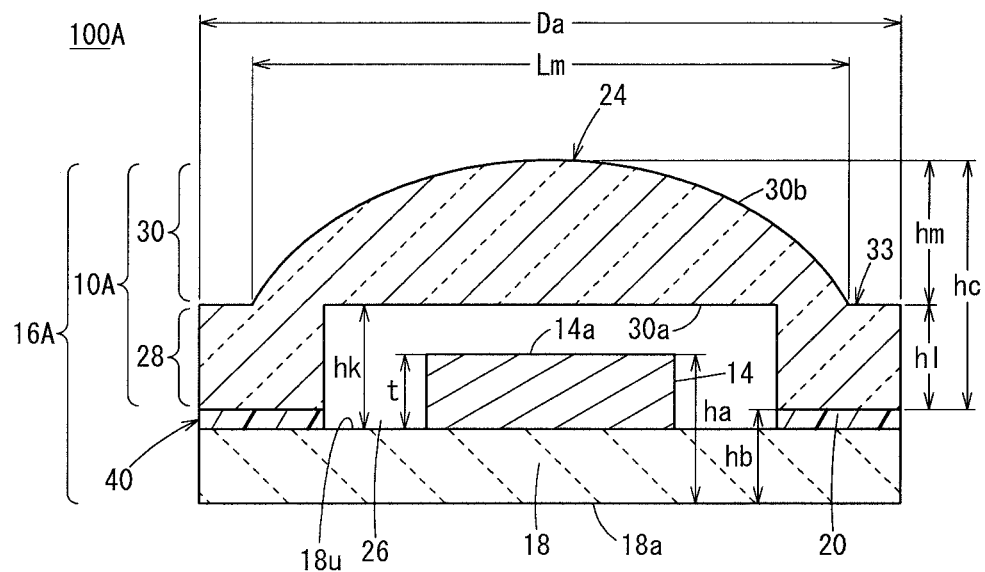
FIG. 1A is a vertical cross-sectional view with partial omission showing an optical component (first optical component) having a transparent sealing member (first transparent sealing member) according to a first embodiment.
Figure 1B:
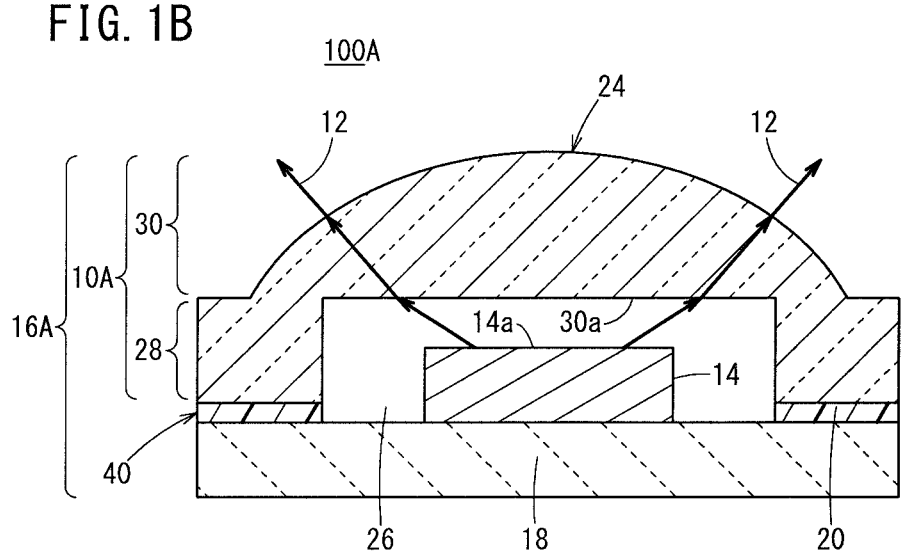
FIG. 1B is a vertical cross-sectional view shown with ultraviolet light included therein.

Initially, as shown in FIGS. 1A and 1B, an optical component (hereinafter referred to as a first optical component 100A) having a transparent sealing member (hereinafter referred to as a first transparent sealing member 10A) according to a first embodiment includes at least one optical element 14 that emits ultraviolet light 12, and a first package 16A in which the optical element 14 is accommodated. The first package 16A includes a mounting substrate 18 on which the optical element 14 is mounted, and the aforementioned first transparent sealing member 10A which is joined on the mounting substrate 18, for example, via an organic adhesive layer 20. The optical element 14 is mounted on the mounting substrate 18. As the adhesive layer 20, an epoxy-based adhesive, a silicone-based adhesive, a urethane-based adhesive, or the like can preferably be used.

Although not illustrated, the optical element 14 is configured, for example, by laminating a GaN-based crystalline layer having a quantum well structure on a sapphire substrate (coefficient of thermal expansion: $7.7 \times 10^{-6}/°$ C.). As a method of mounting the optical element 14, for example, a so-called face up mounting can be employed in which a crystalline layer constituent surface 14a is mounted so as to face the first transparent sealing member 10A, thus being made to function as a light emitting surface. More specifically, terminals (not shown) that are led out from the optical element 14, and circuit wirings (not shown) that are formed on the mounting substrate 18, for example, are electrically connected by bonding wires (not shown). Of course, so-called flip-chip mounting, in which the crystalline layer constituent surface 14a is mounted so as to face the mounting substrate 18, and a rear surface of a sapphire substrate functions as the light emitting surface, can also be favorably employed.

The first transparent sealing member 10A is equipped with a transparent body 24 that is fixed on the mounting substrate 18, and the transparent body 24 includes a concave portion which is open at the bottom thereof, and more specifically an accommodating space 26. The transparent body 24 includes an annular pedestal 28 fixed on the mounting substrate 18, and a lens body 30 that is integrally formed on the pedestal 28. The upper surface of the accommodating space 26 is a flat surface, and the shape of the accommodating space 26, for example, is a quadrangular shape. The shape of the lens body 30, for example, includes a convex low-profile lens shape (tall lens).

The planar shape of a bottom surface 30a of the lens body 30, for example, is a circular shape, and the exterior shape (planar shape) of the pedestal 28, for example, is a square shape. Of course, the planar shape of the bottom surface 30a of the lens body 30 may be an elliptical shape, a track shape, or the like, and the exterior shape of the pedestal 28 may be a circular shape, or a polygonal shape such as a rectangular shape, a triangular shape, a hexagonal shape, or the like.

As a method of manufacturing the first transparent sealing member 10A having such a shape, preferably, a powder sintering method can be employed. For example, a molding slurry containing silica powder and an organic compound is cast into a molding die and solidified by a chemical reaction between organic compounds, for example, a chemical reaction between a dispersion medium and a curing agent, or a chemical reaction of curing agents, and is then removed from the molding die and subjected to firing, whereby the first transparent sealing member 10A can be manufactured.

Concerning the dimensions of the first transparent sealing member 10A, a height hc of the first transparent sealing member 10A is from 0.5 to 10 mm, an outer diameter Da of the pedestal 28 is from 3.0 to 100 mm, and a height hl of the pedestal 28 is from 0.2 to 1 mm. Concerning the lens body 30, a maximum length Lm at a bottom part thereof is from 2.0 to 10 mm, a maximum height hm is from 0.5 to 10 mm, and an aspect ratio (hm/Lm) is, for example, from 0.2 to 1.0. Further, concerning the dimensions of the optical element 14, a thickness t thereof is from 0.005 to 0.5 mm, and although not shown, a vertical dimension as viewed from above is from 0.5 to 2.0 mm, and a horizontal dimension is from 0.5 to 2.0 mm.

Owing to such a configuration, in the first optical component 100A, when the height from a lower surface 18a of the mounting substrate 18 to the crystalline layer constituent surface 14a of the optical element 14 is designated by ha, and the height from the lower surface 18a of the mounting substrate 18 to the upper surface of the adhesive layer 20 (lower surface of the pedestal 28) is designated by hb, the inequality ha>hb is satisfied.

Therefore, even if the light distribution angle of the ultraviolet light 12 emitted from the optical element 14 is greater than or equal to 180°, the ultraviolet light 12, which is emitted in a lateral direction from the crystalline layer constituent surface 14a of the optical element 14, impinges directly on the pedestal 28 of the first transparent sealing member 10A, and scarcely impinges on the joined portion between the mounting substrate 18 and the first transparent sealing member 10A, in other words, the adhesive layer 20.

Further, as shown in FIG. 1B, the ultraviolet light 12 emitted from the optical element 14 is refracted at the bottom surface 30a (the upper surface of the accommodating space 26) of the lens body 30 along the axial direction of the lens body 30, and the light is emitted in a normal direction on a lens surface 30b of the lens body 30.

Therefore, the light distribution angle becomes smaller than in a third transparent sealing member 100 (see FIG. 3A) and a fourth transparent sealing member 10D (see FIG. 4A), which will be described later. The light distribution angle refers to an angular width within which the luminosity becomes ½ of the maximum luminosity in an angular distribution thereof.

In addition, the adhesive layer 20 is formed along an upper surface 18u (mounting surface) of the mounting substrate 18, and between the upper surface 18u of the mounting substrate 18 and the lower surface of the pedestal 28 of the first transparent sealing member 10A. As a result, the ultraviolet light 12 reflected inside the lens body 30 is unlikely to be guided to the sides of the pedestal 28, which contributes to suppressing deterioration of the adhesive layer 20 due to the ultraviolet light 12. It should be noted that, in FIG. 1A, etc., although a case is shown in which the direction of the mounting surface is a horizontal direction, it goes without saying that the direction of the mounting surface may be a vertical direction or the like, depending on the state in which the first optical component 100A is installed. The same considerations apply hereinafter.

Further, in the first optical component 100A, the outer diameter Da of the pedestal 28 of the first transparent sealing member 10A is made wider in the lateral direction than the maximum length Lm of the bottom portion of the lens body 30, to thereby form a discontinuous portion 33 (an overhanging portion at a boundary between the lens body 30 and the pedestal 28) on an outer surface from a top part to the lower surface of the first transparent sealing member 10A. In this case as well, the ultraviolet light 12 reflected inside the lens body 30 is unlikely to be guided to the sides of the pedestal 28, which contributes to suppressing deterioration of the adhesive layer 20 due to the ultraviolet light 12. Consequently, the luminosity at a joined portion 40 between the first transparent sealing member 10A and the mounting substrate 18 can be significantly reduced. As a result, it is possible to avoid a situation in which the ultraviolet light 12 is irradiated onto the organic adhesive layer 20, and to enable an improvement in the durability of the package while using an inexpensive organic adhesive, as well as achieving a reduction in cost.

Figures 5A, 5B, 5C, 5D:
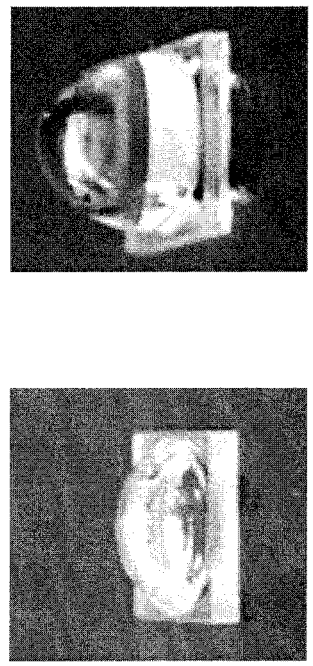
FIGS. 5A to 5D are actual photographs of the first transparent sealing member through the fourth transparent sealing member.
Figure 6B:
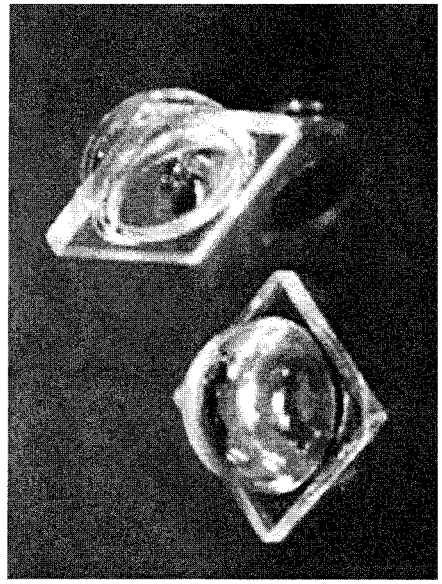
FIG. 6B is an actual photograph of the third transparent sealing member.
Figure 6A:
FIG. 6A is an actual photograph of the first transparent sealing member.

In the foregoing manner, the first transparent sealing member 10A has a structure in which the ultraviolet light 12 is not guided through the first transparent sealing member 10A to the organic adhesive layer 20, while in addition, the ultraviolet light 12 does not directly impinge on the adhesive layer 20. Owing to the structure, it is possible to avoid a situation in which the ultraviolet light 12 is irradiated onto the organic adhesive layer 20, and to enable improvements in the durability of the first package 16A and the light extraction efficiency, while using the organic adhesive layer 20 which is low in cost. More specifically, the first optical component 100A enables an improvement in the durability at low cost. The light extraction efficiency refers to the ratio of the light output that is emitted to the exterior of the package, to the light output that is emitted from the optical element 14. Moreover, actual photographs of the first transparent sealing member 10A are shown in FIGS. 5A and 6A.

Next, a description will be given with reference to FIGS. 2A and 2B concerning a second optical component 100B having a transparent sealing member (hereinafter, referred to as a second transparent sealing member 10B) according to a second embodiment.

Figure 2A:
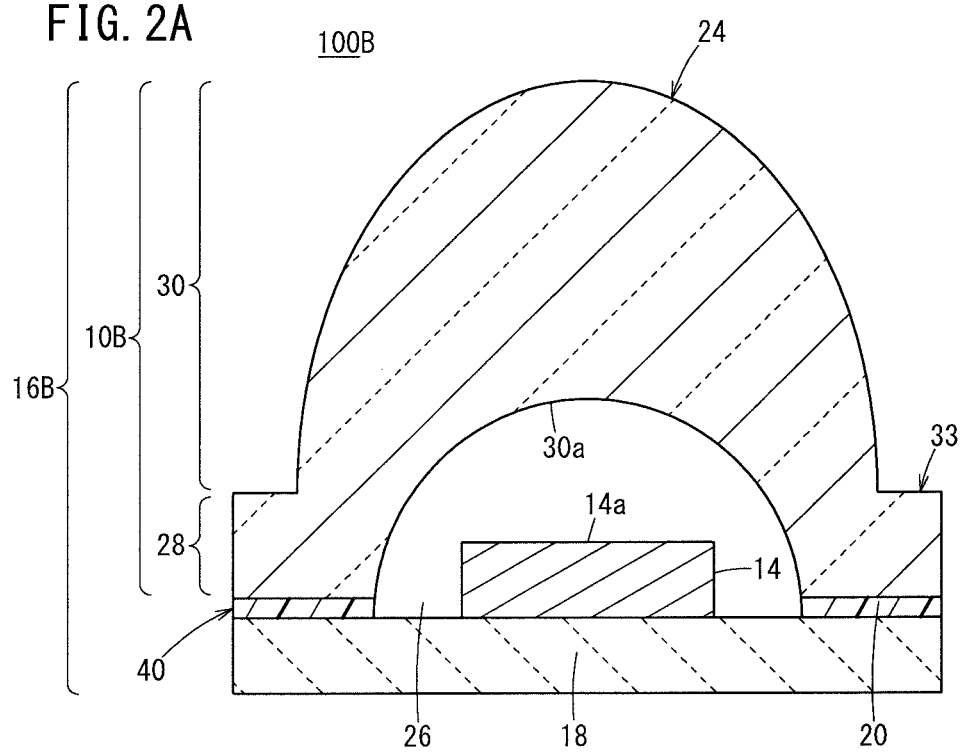
FIG. 2A is a vertical cross-sectional view with partial omission showing an optical component (second optical component) having a transparent sealing member (second transparent sealing member) according to a second embodiment.

The second optical component 100B includes a second package 16B, as shown in FIG. 2A. The second package 16B has substantially the same configuration as that of the first package 16A of the first optical component 100A described above, but differs therefrom in that an aspect ratio (vertical/horizontal) of the lens body 30 constituting the second transparent sealing member 10B of the second package 16B is made larger (in the form of a tall lens) than in the first transparent sealing member 10A, and furthermore, the accommodating space 26 is formed in a hemispherical shape (hemispherical dome shape).

Figure 2B:
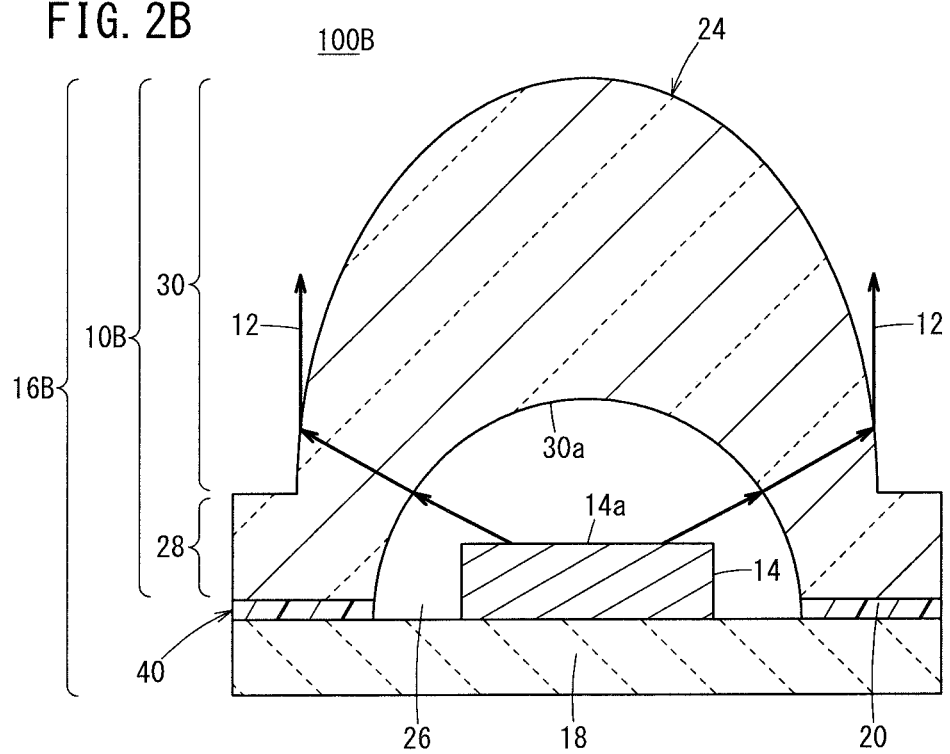
FIG. 2B is a vertical cross-sectional view shown with ultraviolet light included therein.

With the second transparent sealing member 10B, as shown in FIG. 2B, the ultraviolet light 12 emitted from the optical element 14 passes through the bottom surface 30a of the lens body 30 (the upper surface of the accommodating space 26) without being refracted, and then is refracted at the lens surface 30b of the lens body 30 along the axial direction of the lens body 30, and is emitted from the lens body 30. Therefore, the light distribution angle becomes smaller than in the first transparent sealing member 10A.

In this case as well, it is possible to avoid a situation in which the ultraviolet light 12 is irradiated onto the organic adhesive layer 20, and to enable improvements in the durability of the second package 16B and the light extraction efficiency, while using the organic adhesive layer 20 which is low in cost. More specifically, the second optical component 100B enables an improvement in the durability at low cost. Moreover, an actual photograph of the second transparent sealing member 10B is shown in FIG. 5B.

Next, a description will be given with reference to FIGS. 3A and 3B concerning a third optical component 100C having a transparent sealing member (hereinafter, referred to as the third transparent sealing member 10C) according to a third embodiment.

Figure 3A:
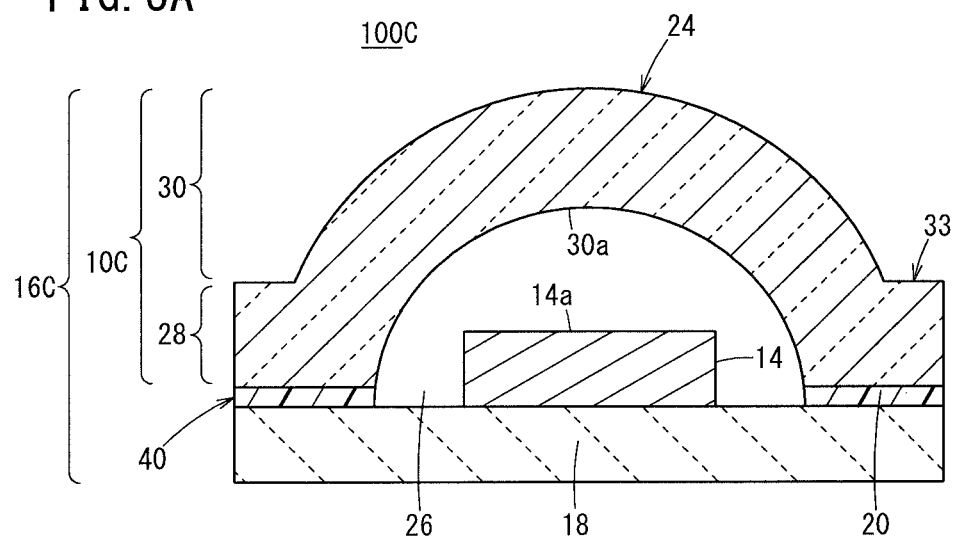
FIG. 3A is a vertical cross-sectional view with partial omission showing an optical component (third optical component) having a transparent sealing member (third transparent sealing member) according to a third embodiment.

The third optical component 100C includes a third package 16C, as shown in FIG. 3A. The third package 16C has substantially the same configuration as that of the first package 16A of the first optical component 100A described above, but differs therefrom in that the shape of the lens body 30 constituting the third transparent sealing member 10C is a hemispherical shape (hemispherical lens), and furthermore, the accommodating space 26 is formed in a hemispherical shape (hemispherical dome shape), whereby the light distribution angle is made larger than in the first transparent sealing member 10A.

Figure 3B:
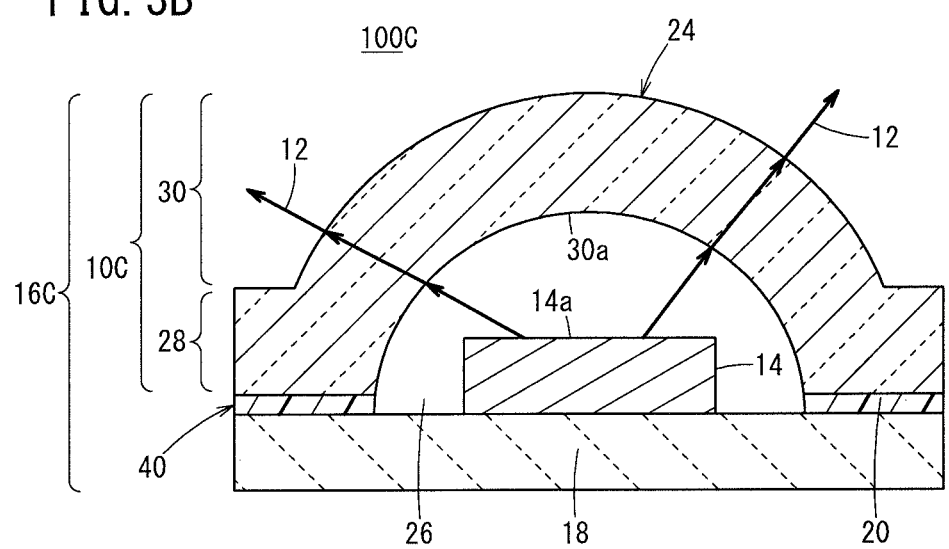
FIG. 3B is a vertical cross-sectional view shown with ultraviolet light included therein.

With the third transparent sealing member 10C, as shown in FIG. 3B, the ultraviolet light 12 emitted from the optical element 14 passes through the bottom surface 30a of the lens body 30 (the upper surface of the accommodating space 26) without being refracted, and then is emitted from the lens body 30 without being refracted at the lens surface 30b of the lens body 30. Therefore, the light distribution angle becomes larger than in the first transparent sealing member 10A and the second transparent sealing member 10B.

In this case as well, it is possible to avoid a situation in which the ultraviolet light 12 is irradiated onto the organic adhesive layer 20, and to enable improvements in the durability of the third package 16C and the light extraction efficiency, while using the organic adhesive layer 20 which is low in cost. More specifically, the third optical component 100C also enables an improvement in the durability at low cost. Moreover, actual photographs of the third transparent sealing member 10C are shown in FIGS. 5C and 6B.

Next, a description will be given with reference to FIGS. 4A and 4B concerning a fourth optical component 100D having a transparent sealing member (hereinafter, referred to as the fourth transparent sealing member 10D) according to a fourth embodiment.

Figure 4A:
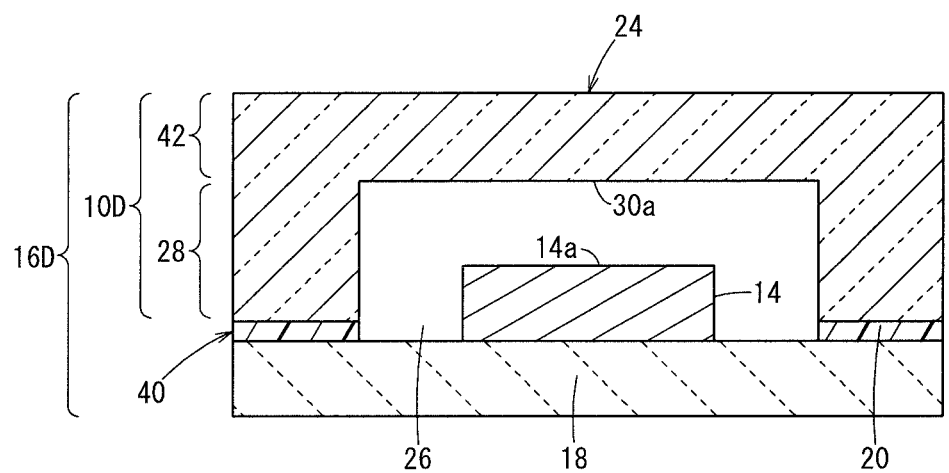
FIG. 4A is a vertical cross-sectional view with partial omission showing an optical component (fourth optical component) having a transparent sealing member (fourth transparent sealing member) according to a fourth embodiment.

The fourth optical component 100D includes a fourth package 16D, as shown in FIG. 4A. The fourth package 16D has substantially the same configuration as that of the first package 16A of the first optical component 100A described above, but differs therefrom in that it includes the pedestal 28 that is fixed on the mounting substrate 18, and a flat plate 42 that is formed integrally on the pedestal 28.

Therefore, even if the light distribution angle of the ultraviolet light 12 emitted from the optical element 14 is greater than or equal to 180°, the ultraviolet light 12, which is emitted in a lateral direction from the crystalline layer constituent surface 14a of the optical element 14, impinges directly on the pedestal 28 of the fourth transparent sealing member 10D, and scarcely impinges on the joined portion 40 between the mounting substrate 18 and the fourth transparent sealing member 10D, in other words, the adhesive layer 20.

Figure 4B:
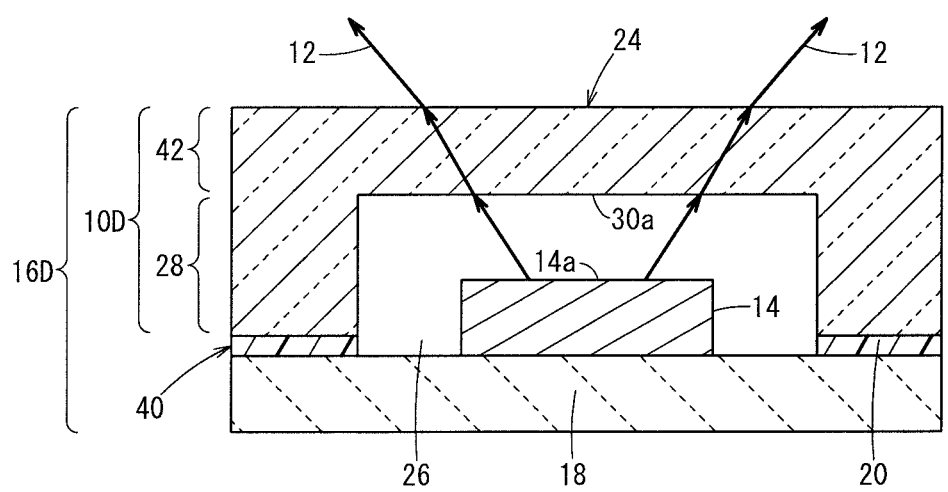
FIG. 4B is a vertical cross-sectional view shown with ultraviolet light included therein.

With the fourth transparent sealing member 10D, as shown in FIG. 4B, the ultraviolet light 12 emitted from the optical element 14 is refracted at the upper surface of the accommodating space 26 along the direction of the optical axis of the optical element 14, and is refracted at the surface of the flat plate 42 (the fourth transparent sealing member 10D) in a direction away from the optical axis of the optical element 14, and is emitted from the flat plate 42. Therefore, the light distribution angle becomes larger than in the first transparent sealing member 10A and the second transparent sealing member 10B. Moreover, an actual photograph of the fourth transparent sealing member 10D is shown in FIG. 5D.

Next, a description will be given with reference to FIG. 7A concerning a fifth optical component 100E having a transparent sealing member (hereinafter, referred to as a fifth transparent sealing member 10E) according to a fifth embodiment.

Figure 7A:
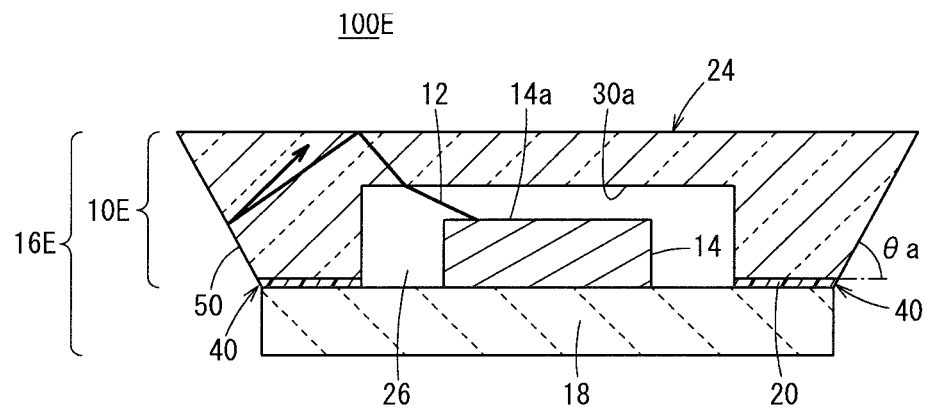
FIG. 7A is a vertical cross-sectional view with partial omission showing an optical component (fifth optical component) having a transparent sealing member (fifth transparent sealing member) according to a fifth embodiment.

The fifth optical component 100E includes a fifth package 16E, as shown in FIG. 7A. The fifth package 16E has substantially the same configuration as that of the fourth package 16D of the fourth optical component 100D described above, but differs therefrom in that the outer peripheral portion of the fifth transparent sealing member 10E, which is configured in a flat plate shape, has a shape that continuously expands as it separates away from the mounting substrate 18, and more specifically, has an inclined surface 50. In accordance with such a configuration, even if the ultraviolet light 12 emitted from the optical element 14 is reflected downward on the upper surface of the fifth transparent sealing member 10E, since the ultraviolet light 12 is reflected upward at the inclined surface 50 on the outer peripheral portion, the light extraction efficiency can be improved.

Next, a description will be given with reference to FIG. 7B concerning a sixth optical component 100F having a transparent sealing member (hereinafter, referred to as a sixth transparent sealing member 10F) according to a sixth embodiment.

Figure 7B:
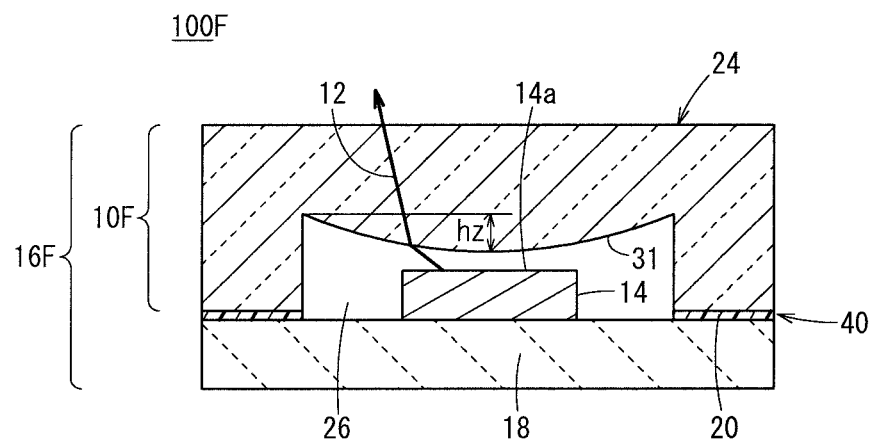
FIG. 7B is a vertical cross-sectional view with partial omission showing an optical component (sixth optical component) having a transparent sealing member (sixth transparent sealing member) according to a sixth embodiment.

The sixth optical component 100F includes a sixth package 16F, as shown in FIG. 7B. The sixth package 16F has substantially the same configuration as that of the fourth package 16D of the fourth optical component 100D described above, but differs therefrom in that the upper surface of the accommodating space 26 is formed in a convex shape oriented toward the mounting substrate 18, and more specifically, includes a downward convex portion 31 formed in a lens shape in the accommodating space 26. Consequently, the ultraviolet light 12 emitted from the optical element 14 can be controlled so as to be directed upwardly, and it is possible to reduce the light that is guided to the side surface portion.

Next, a description will be given with reference to FIG. 8A concerning a seventh optical component 100G having a transparent sealing member (hereinafter, referred to as a seventh transparent sealing member 10G) according to a seventh embodiment.

The seventh optical component 100G includes a seventh package 16G. The seventh package 16G has substantially the same configuration as that of the fourth package 16D of the fourth optical component 100D described above, but differs therefrom in that it includes a groove (hereinafter, referred to as an outer peripheral groove 52) along an outer periphery on an outer peripheral portion of the seventh transparent sealing member 10G which is configured in a flat plate shape. In particular, the outer peripheral groove 52 has a shape that continuously expands as it separates away from the mounting substrate 18, and more specifically, has an inclined surface 52a. Consequently, within the ultraviolet light 12 emitted from the optical element 14, ultraviolet light having a small angle of emission (ultraviolet light emitted in a lateral direction) is controlled so as to be reflected upwardly at the inclined surface 52a of the outer peripheral groove 52. Therefore, it is possible to reduce the light that is guided to the side surface portion.

Next, a description will be given with reference to FIG. 8B concerning an eighth optical component 100H having a transparent sealing member (hereinafter, referred to as an eighth transparent sealing member 10H) according to an eighth embodiment.

Figure 8A:
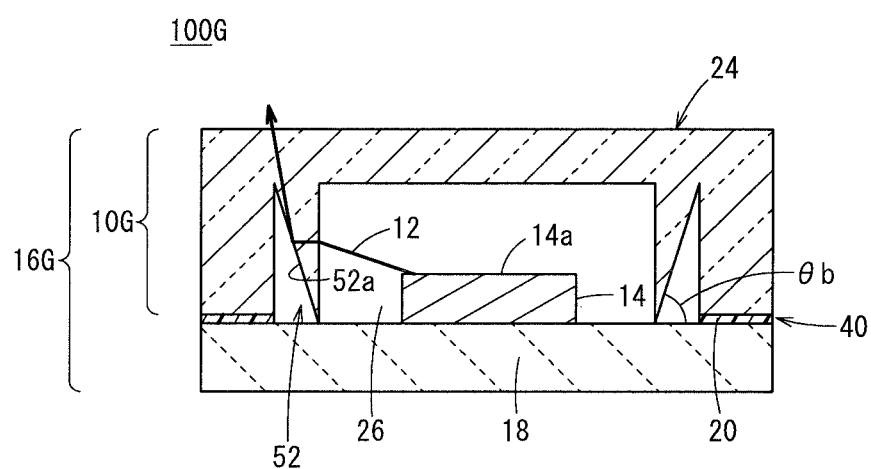
FIG. 8A is a vertical cross-sectional view with partial omission showing an optical component (seventh optical component) having a transparent sealing member (seventh transparent sealing member) according to a seventh embodiment.
Figure 8B:
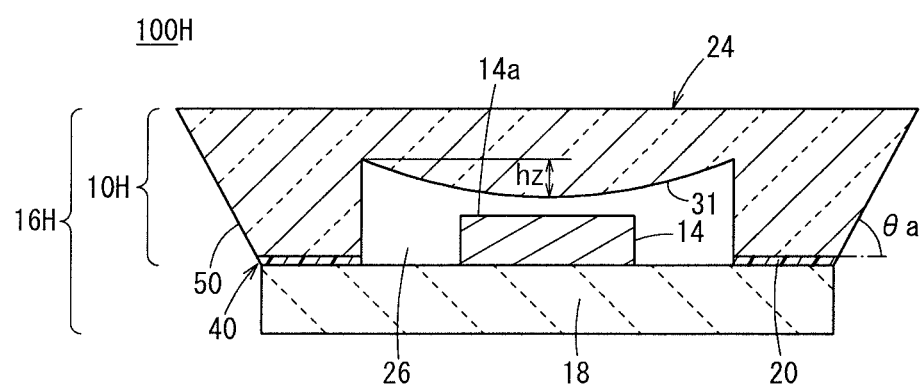
FIG. 8B is a vertical cross-sectional view with partial omission showing an optical component (eighth optical component) having a transparent sealing member (eighth transparent sealing member) according to an eighth embodiment.

The eighth optical component 100H includes an eighth package 16H, as shown in FIG. 8B. The eighth package 16H has substantially the same configuration as that of the fifth package 16E (see FIG. 7A) of the fifth optical component 100E described above, but differs therefrom in that, similar to the sixth optical component 100F, the upper surface of the accommodating space 26 is formed in a convex shape oriented toward the mounting substrate 18, and more specifically, includes a downward convex portion 31 formed in a lens shape in the accommodating space 26. In accordance with such a configuration, the eighth optical component 100H can have both the effect of the fifth optical component 100E and the effect of the sixth optical component 100F, and enables an improvement in the light extraction efficiency, together with enabling a reduction in the light that is guided to the side surface portion.

Next, a description will be given with reference to FIGS. 9A and 9B concerning a ninth optical component 100I having a transparent sealing member (hereinafter, referred to as a ninth transparent sealing member 10I) according to a ninth embodiment, and a tenth optical component 100J having a transparent sealing member (hereinafter, referred to as a tenth transparent sealing member 10J) according to a tenth embodiment.

Figure 9A:
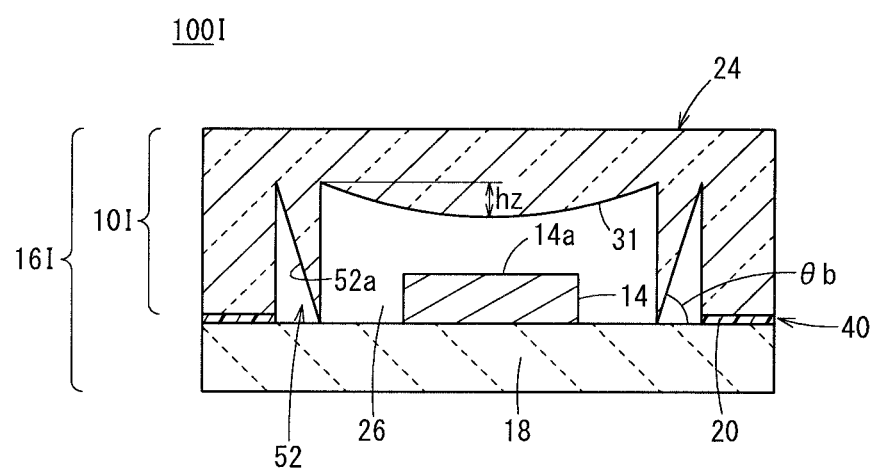
FIG. 9A is a vertical cross-sectional view with partial omission showing an optical component (ninth optical component) having a transparent sealing member (ninth transparent sealing member) according to a ninth embodiment.

The ninth optical component 100I includes a ninth package 16I, as shown in FIG. 9A. The ninth package 16I has substantially the same configuration as that of the sixth package 16F of the sixth optical component 100F shown in FIG. 7B, but differs therefrom in that it includes the outer peripheral groove 52 along an outer periphery on an outer peripheral portion of the ninth transparent sealing member 10I which is configured in a flat plate shape. In accordance with such a configuration, the ninth optical component 100I can have both the effect of the sixth optical component 100F and the effect of the seventh optical component 100G, and enables an improvement in the light extraction efficiency, together with enabling a reduction in the light that is guided to the side surface portion.

Figure 9B:
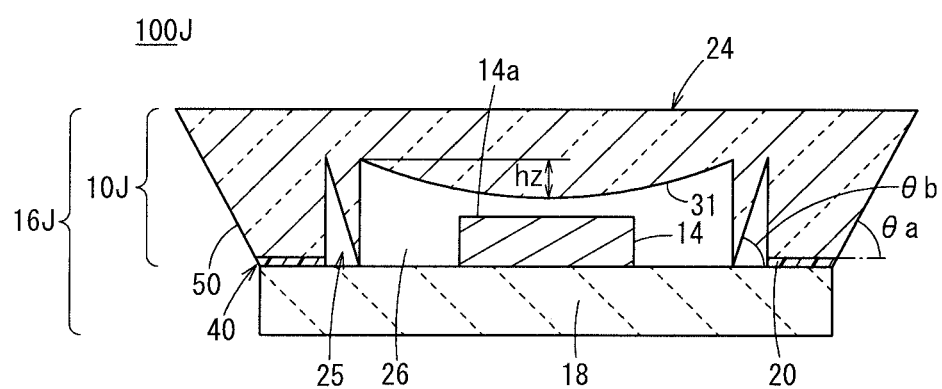
FIG. 9B is a vertical cross-sectional view with partial omission showing an optical component (tenth optical component) having a transparent sealing member (tenth transparent sealing member) according to a tenth embodiment.

The tenth optical component 100J includes a tenth package 16J, as shown in FIG. 9B. The tenth package 16J has substantially the same configuration as that of the eighth package 16H of the eighth optical component 100H shown in FIG. 8B, but differs therefrom in that it includes the outer peripheral groove 52 along an outer periphery on an outer peripheral portion of the tenth transparent sealing member 10J which is configured in a flat plate shape. In accordance with such a configuration, the tenth optical component 100J can have both the effect of the eighth optical component 100H and the effect of the seventh optical component 100G, and enables an improvement in the light extraction efficiency, together with enabling a reduction in the light that is guided to the side surface portion.

EXEMPLARY EMBODIMENTS

First Exemplary Embodiment

Next, in relation to Exemplary Embodiments 1, 2, 3, and 4, and a Comparative Example, the light distribution, the light distribution angle, the light extraction efficiency, and the luminosity at each of the joined portions were confirmed.

Exemplary Embodiment 1

The transparent sealing member according to Exemplary Embodiment 1 has the same configuration as that of the first transparent sealing member 10A shown in FIG. 1A, and the optical component according to Exemplary Embodiment 1 has the same configuration as that of the first optical component 100A shown in FIG. 1A. The outer size of the transparent sealing member according to Exemplary Embodiment 1 is 3.5 mm square, and the height thereof is 1.5 mm. Moreover, the outer size of the mounted LED chip is 1 mm square. The same considerations apply hereinafter.

The light distribution, the light distribution angle, the light extraction efficiency, and the luminosity at the lens joined portion of the optical component according to Exemplary Embodiment 1 were confirmed by way of simulation.

Exemplary Embodiment 2

The transparent sealing member according to Exemplary Embodiment 2 has the same configuration as that of the second transparent sealing member 10B shown in FIG. 2A, and the optical component according to Exemplary Embodiment 2 has the same configuration as that of the second optical component 100B shown in FIG. 2A.

The outer size of the transparent sealing member according to Exemplary Embodiment 2 is 3.5 mm square, and the height thereof is 3 mm.

In the same manner as in Exemplary Embodiment 1, the light distribution, the light distribution angle, the light extraction efficiency, and the luminosity at the lens joined portion of the optical component according to Exemplary Embodiment 2 were confirmed by way of simulation.

Exemplary Embodiment 3

The transparent sealing member according to Exemplary Embodiment 3 has the same configuration as that of the third transparent sealing member 10C shown in FIG. 3A, and the optical component according to Exemplary Embodiment 3 has the same configuration as that of the third optical component 100C shown in FIG. 3A.

The outer size of the transparent sealing member according to Exemplary Embodiment 3 is 3.5 mm square, and the height thereof is 1.6 mm.

In the same manner as in Exemplary Embodiment 1, the light distribution, the light distribution angle, the light extraction efficiency, and the luminosity at the lens joined portion of the optical component according to Exemplary Embodiment 3 were confirmed by way of simulation.

Exemplary Embodiment 4

The transparent sealing member according to Exemplary Embodiment 4 has the same configuration as that of the fourth transparent sealing member 10D shown in FIG. 4A, and the optical component according to Exemplary Embodiment 4 has the same configuration as that of the fourth optical component 100D shown in FIG. 4A.

The outer size of the transparent sealing member according to Exemplary Embodiment 4 is 3.5 mm square, and the height thereof is 0.9 mm.

In the same manner as in Exemplary Embodiment 1, the light distribution, the light distribution angle, the light extraction efficiency, and the luminosity at the lens joined portion of the optical component according to Exemplary Embodiment 4 were confirmed by way of simulation.

Comparative Example

Figure 21A:
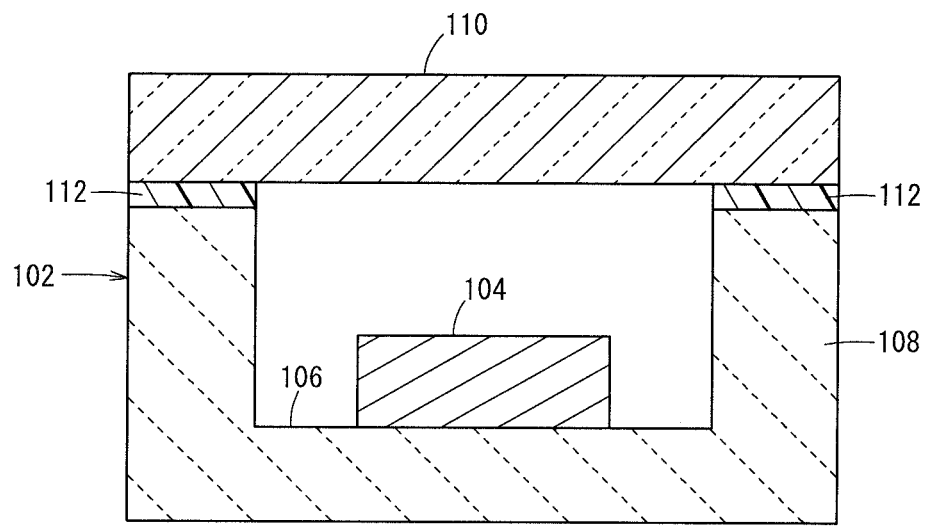
FIG. 21A is a vertical cross-sectional view with partial omission showing an optical component having a transparent sealing member according to a conventional example.
Figure 21B:
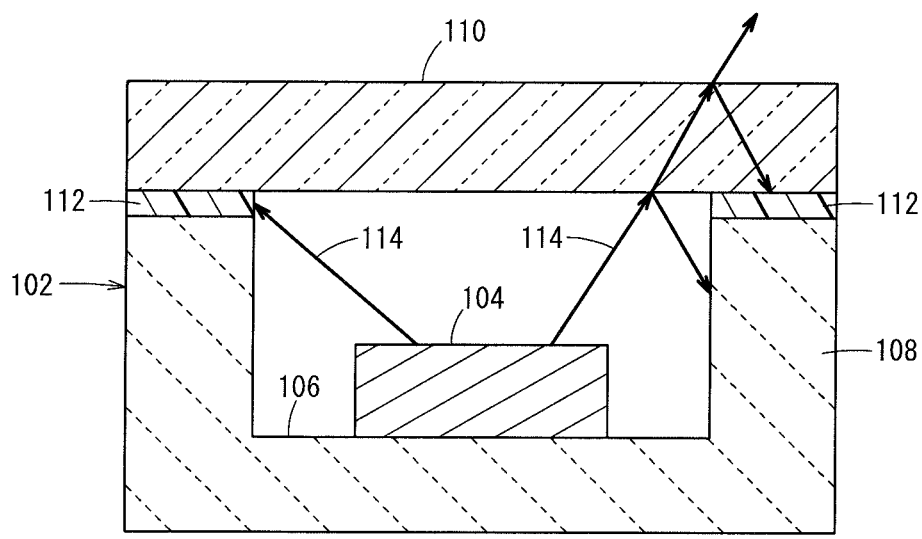
FIG. 21B is a vertical cross-sectional view shown with ultraviolet light included therein.

The transparent sealing member according to the Comparative Example has the same configuration as that of the lid member 110 of the optical component 200 shown in FIG. 21A.

(Manufacturing of Transparent Sealing Member and Optical Component)

The outer size of the transparent sealing member according to the Comparative Example is 3.5 mm square, and the height (thickness) thereof is 0.5 mm.

In the same manner as in Exemplary Embodiment 1, the light distribution, the light distribution angle, the light extraction efficiency, and the luminosity at the joined portion of the optical component according to the Comparative Example were confirmed by way of simulation.

[Simulation Results]

The light distribution, the light distribution angle, the light extraction efficiency, and the luminosity at each of the joined portions of the optical components according to Exemplary Embodiments 1 to 4 and the Comparative Example are shown in Table 1 of FIG. 10.

The light distribution angle refers to an angular width within which the luminosity becomes ½ of the maximum luminosity in an angular distribution thereof. The light extraction efficiency refers to the ratio of the light output emitted to the exterior of the optical component, to the light output emitted from the LED chip. The luminosities at the respective joined portions are indicated by relative values when the luminosity of the Comparative Example is regarded as being 100.

<Light Distribution>

Regarding the light distribution, a large difference does not exist between Exemplary Embodiment 3, Exemplary Embodiment 4, and the Comparative Example, and they all have substantially the same light distribution. Such a feature is also the same concerning the light distribution angle, and the difference in the light distribution angle between Exemplary Embodiment 3 and Exemplary Embodiment 4 is within 10°.

In contrast thereto, unlike Exemplary Embodiment 3, etc., it is seen that Exemplary Embodiment 1 and Exemplary Embodiment 2 have their directivity. More specifically, concerning the light distribution angle, Exemplary Embodiment 2 exhibits the narrowest light distribution angle at 25°, and Exemplary Embodiment 1 exhibits a light distribution angle of 77°, which is significantly narrower than the light distribution angle of Exemplary Embodiment 3, etc.

<Light Extraction Efficiency>

On the other hand, in the Comparative Example, the light extraction efficiency was the lowest at 75%. In contrast thereto, in any of Exemplary Embodiments 1 to 3, it is seen that the light extraction efficiency is high, at 93%. Concerning Exemplary Embodiment 4 as well, the light extraction efficiency is 91%, which compares favorably with that of Exemplary Embodiments 1 to 3.

From these results, it is understood that the first transparent sealing member 10A and the second transparent sealing member 10B are suitable in terms of controlling the light distribution angle, as well as improving the light extraction efficiency. Further, it is understood that the third transparent sealing member 10C and the fourth transparent sealing member 10D are suitable in terms of improving the light extraction efficiency.

<Luminosity at the Joined Portion>

Regarding the luminosity at the joined portion, when the luminosity of the Comparative Example is regarded as being 100, the luminosity is less than 10 in Exemplary Embodiments 1 to 3, and it is understood that Exemplary Embodiments 1 to 3 significantly contribute to a reduction in luminosity at the joined portion, and more specifically, serve to prevent ultraviolet light from being incident on the adhesive layer. Moreover, in Exemplary Embodiment 4, since the upper surface (the surface from which the ultraviolet light 12 is irradiated to the exterior) is flat, as in the below-described Comparative Example, there are cases in which the light which is reflected at the upper surface may be irradiated onto the joined portion. Therefore, although the luminosity of Exemplary Embodiment 4 is 87, which is somewhat inferior to that of Exemplary Embodiments 1 to 3, it is understood that the transparent sealing member of Exemplary Embodiment 4 contributes to a reduction in luminosity at the joined portion.

Figure 11A:
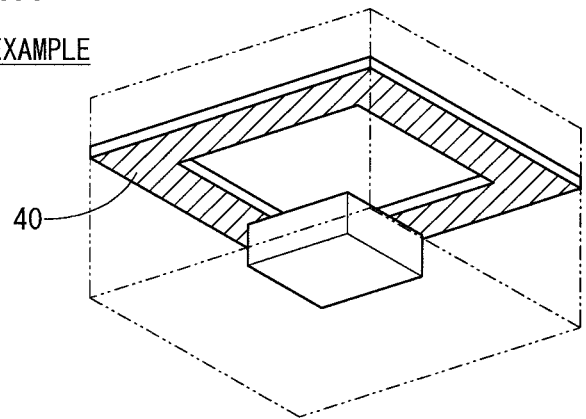
FIG. 11A is a transparent perspective view showing a joined portion of an optical component according to a Comparative Example.
Figure 11B:
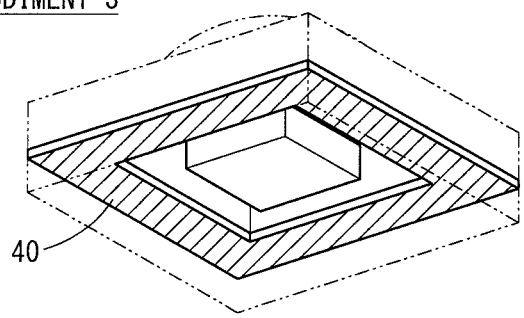
FIG. 11B is a transparent perspective view showing a joined portion of an optical component according to an Exemplary Embodiment 3.
Figure 11C:
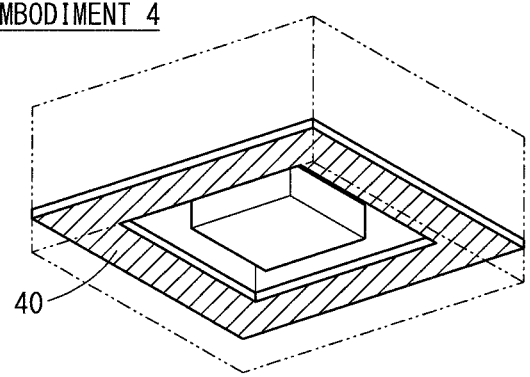
FIG. 11C is a transparent perspective view showing a joined portion of an optical component according to an Exemplary Embodiment 4.

Typically, in the Comparative Example, and in Exemplary Embodiments 3 and 4, as shown in FIGS. 11A, 11B, and 11C, an annular joined portion made of an organic adhesive is formed. In the Comparative Example, as discussed above, a structure is formed in which the joined portion is easily irradiated with ultraviolet light, and by the adhesive of the joined portion being deteriorated thereby, a concern arises in that the reliability (useful lifetime) of the LED may be reduced.

In contrast thereto, in Exemplary Embodiments 3 and 4, the light intensity that is irradiated onto the joined portion is significantly reduced, and deterioration of the adhesive layer of the joint portion can be suppressed. It is understood that such a feature can improve the durability of the package while using an inexpensive organic adhesive, and is also advantageous in terms of cost. The same feature also applies to Exemplary Embodiment 1 and Exemplary Embodiment 2.

Second Exemplary Embodiment

Next, in relation to Exemplary Embodiments 5, 6, 7, 8, and 9, the light distribution, the light distribution angle, the light extraction efficiency, and the luminosity at each of the joined portions were confirmed.

Exemplary Embodiment 5

The transparent sealing member according to Exemplary Embodiment 5 has the same configuration as that of the fifth transparent sealing member 10E shown in FIG. 7A, and the optical component according to Exemplary Embodiment 5 has the same configuration as that of the fifth optical component 100E shown in FIG. 7A. The outer size of the transparent sealing member according to Exemplary Embodiment 5 is 4.5 mm square, the height thereof is 0.9 mm, and the angle θa of the inclined surface 50 is 60° with respect to the horizontal plane. Moreover, the outer size of the mounted LED chip is 1 mm square. The same considerations apply hereinafter.

The light distribution, the light distribution angle, the light extraction efficiency, and the luminosity at the lens joined portion of the optical component according to Exemplary Embodiment 5 were confirmed by way of simulation.

Exemplary Embodiment 6

The transparent sealing member according to Exemplary Embodiment 6 has the same configuration as that of the sixth transparent sealing member 10F shown in FIG. 7B, and the optical component according to Exemplary Embodiment 6 has the same configuration as that of the sixth optical component 100F shown in FIG. 7B.

The outer size of the transparent sealing member according to Exemplary Embodiment 6 is 3.5 mm square, the height thereof is 1.5 mm, and a bulging height hz of the downward convex portion 31 is 0.3 mm.

In the same manner as in Exemplary Embodiment 5, the light distribution, the light distribution angle, the light extraction efficiency, and the luminosity at the lens joined portion of the optical component according to Exemplary Embodiment 6 were confirmed by way of simulation.

Exemplary Embodiment 7

The transparent sealing member according to Exemplary Embodiment 7 has the same configuration as that of the seventh transparent sealing member 10G shown in FIG. 8A, and the optical component according to Exemplary Embodiment 7 has the same configuration as that of the seventh optical component 100G shown in FIG. 8A.

The outer size of the transparent sealing member according to Exemplary Embodiment 7 is 3.5 mm square, and the height thereof is 1.5 mm. The angle θb of the inclined surface 52a of the outer peripheral groove 52 is 60° with respect to the horizontal plane.

In the same manner as in Exemplary Embodiment 5, the light distribution, the light distribution angle, the light extraction efficiency, and the luminosity at the lens joined portion of the optical component according to Exemplary Embodiment 7 were confirmed by way of simulation.

Exemplary Embodiment 8

The transparent sealing member according to Exemplary Embodiment 8 has the same configuration as that of the eighth transparent sealing member 10H shown in FIG. 8B, and the optical component according to Exemplary Embodiment 8 has the same configuration as that of the eighth optical component 100H shown in FIG. 8B.

The outer size of the transparent sealing member according to Exemplary Embodiment 8 is 4.5 mm square, and the height thereof is 0.9 mm. The angle θa of the inclined surface 50 is 60° with respect to the horizontal plane, and the bulging height hz of the downward convex portion 31 is 0.3 mm.

In the same manner as in Exemplary Embodiment 5, the light distribution, the light distribution angle, the light extraction efficiency, and the luminosity at the lens joined portion of the optical component according to Exemplary Embodiment 8 were confirmed by way of simulation.

Exemplary Embodiment 9

The transparent sealing member according to Exemplary Embodiment 9 has the same configuration as that of the ninth transparent sealing member 10I shown in FIG. 9A, and the optical component according to Exemplary Embodiment 9 has the same configuration as that of the ninth optical component 100I shown in FIG. 9A.

The outer size of the transparent sealing member according to Exemplary Embodiment 9 is 3.5 mm square, and the height thereof is 1.5 mm. The angle θb of the inclined surface 52a is 60° with respect to the horizontal plane, and the bulging height hz of the downward convex portion 31 is 0.3 mm.

In the same manner as in Exemplary Embodiment 5, the light distribution, the light distribution angle, the light extraction efficiency, and the luminosity at the lens joined portion of the optical component according to Exemplary Embodiment 9 were confirmed by way of simulation.

[Simulation Results]

The light distribution, the light distribution angle, the light extraction efficiency, and the luminosity at each of the joined portions of the optical components according to Exemplary Embodiments 5 to 9 are shown in Table 2 of FIG. 12.

<Light Distribution>

Regarding the light distribution, a large difference does not exist between Exemplary Embodiment 5 and Exemplary Embodiment 7, and both have substantially the same light distribution. Further, a large difference does not exist between Exemplary Embodiment 6, Exemplary Embodiment 8, and Exemplary Embodiment 9, and they all have substantially the same light distribution. Such a feature is also the same concerning the light distribution angle.

<Light Extraction Efficiency>

Concerning the light extraction efficiency, in any of Exemplary Embodiments 7 to 9, it is seen that the light extraction efficiency is high, at 93%. Concerning Exemplary Embodiments 5 and 6 as well, the light extraction efficiency is 92%, 91%, which compares favorably with that of Exemplary Embodiments 7 to 9.

From these results, concerning the fifth transparent sealing member 10E through the ninth transparent sealing member 10I as well, it is understood that they are suitable in terms of controlling the light distribution angle, as well as improving the light extraction efficiency. Further, it is understood that the seventh transparent sealing member 10G through the ninth transparent sealing member 10I are suitable in terms of improving the light extraction efficiency.

<Luminosity at the Joined Portion>

Regarding the luminosity at the joined portion, when the luminosity of the Comparative Example is regarded as being 100 (refer to FIG. 10), the luminosity is 18 in Exemplary Embodiment 8, and the luminosity is 21 in Exemplary Embodiment 9, and it is understood that the embodiments contribute to a reduction in luminosity at the joined portion, and more specifically, serve to prevent ultraviolet light from being incident on the adhesive layer. Concerning Exemplary Embodiment 5, although the luminosity at the joined portion was somewhat higher than that in Exemplary Embodiments 8 and 9, the luminosity was still low, at 36. Moreover, in Exemplary Embodiments 6 and 7, although the luminosity at the joined portion was high, at 64 and 61, the luminosity was of a lower value than in Exemplary Embodiment 4 shown in FIG. 10.

From these results, it is understood that by forming the upper surface of the accommodating space 26 in a lens shape, the light distribution angle can be suitably controlled, and by providing the inclined surface 50, the light extraction efficiency can be increased, and the luminosity at the joined portion can be lowered.

Third Exemplary Embodiment

Next, in relation to the lenses for which the shapes of the lens bodies are the low lens, the tall lens, and the hemispherical lens (Exemplary Embodiments 1 to 3 and Exemplary Embodiments 10 to 26), it was confirmed how the difference in the light extraction efficiency and the luminosity at the joined portions thereof changes, depending on the lens height, the member height, and the like.

The configurations of Exemplary Embodiments 1 to 3 are the same as those of Exemplary Embodiments 1 to 3 that were used in the above-described first exemplary embodiment. More specifically, as shown in Table 3 of FIG. 13, concerning the lens shape, Exemplary Embodiment 1 is the low lens, Exemplary Embodiment 2 is the tall lens, and Exemplary Embodiment 3 is the hemispherical lens.

Concerning the shape of the accommodating space 26, Exemplary Embodiment 1 is of a quadrangular shape, and Exemplary Embodiments 2 and 3, respectively, are of a hemispherical dome shape.

On the other hand, concerning the lens shape of Exemplary Embodiments 10 to 26, as shown in Table 4 of FIG. 14 through Table 8 of FIG. 18, Exemplary Embodiment 10, Exemplary Embodiment 11, Exemplary Embodiment 12, Exemplary Embodiment 18, and Exemplary Embodiment 19, respectively, are the low lenses, Exemplary Embodiments 14 to 17 and 22 to 26, respectively, are the tall lenses, and Exemplary Embodiments 13, 20, and 21, respectively, are the hemispherical lenses.

Concerning the shape of the accommodating space 26, Exemplary Embodiments 10 to 17 are of a quadrangular shape, Exemplary Embodiments 18, 19, 21 to 24, and 26 are of a hemispherical dome shape, Exemplary Embodiment 20 is of a tall dome shape, and Exemplary Embodiment 25 is of a low dome shape. Moreover, the tall dome shape refers to a dome shape in which a maximum height (hk) of the accommodating space 26 is taller than ½ of a maximum outer diameter of the accommodating space 26, whereas the low dome shape refers to a dome shape in which the maximum height (hk) of the accommodating space 26 is lower than ½ of the maximum outer diameter of the accommodating space 26.

Apart therefrom, concerning Exemplary Embodiments 1 to 3 and 10 to 26, the lens diameter (Lm), the lens height (hm), the pedestal height (hl), the pedestal outer diameter (Da), the member height (hc), the accommodating space outer diameter, and the accommodating space height (hk) are as shown in Tables 3 to 8 of FIGS. 13 to 18. Moreover, concerning the lens diameter (Lm) and the lens height (hm), etc., refer to FIG. 1A.

Further, according to the third exemplary embodiment, the parameter H is defined by the following equation (1) in which various height factors are collected together.

$$\text{Parameter } H = hm^3 - hk^x + hl \quad (1)$$

In this instance, concerning the variable x, x=1 in the case that the accommodating space 26 is of a quadrangular shape, and x=3 in the case that the accommodating space 26 is of a dome shape.

In addition, the light distribution angle, the light extraction efficiency, and the luminosity at the lens joined portion of the optical components according to Exemplary Embodiments 1 to 3 and 10 to 26 were confirmed by way of simulation. The results thereof are shown in Table 3 to Table 8 of FIGS. 13 to 18.

Figure 19:
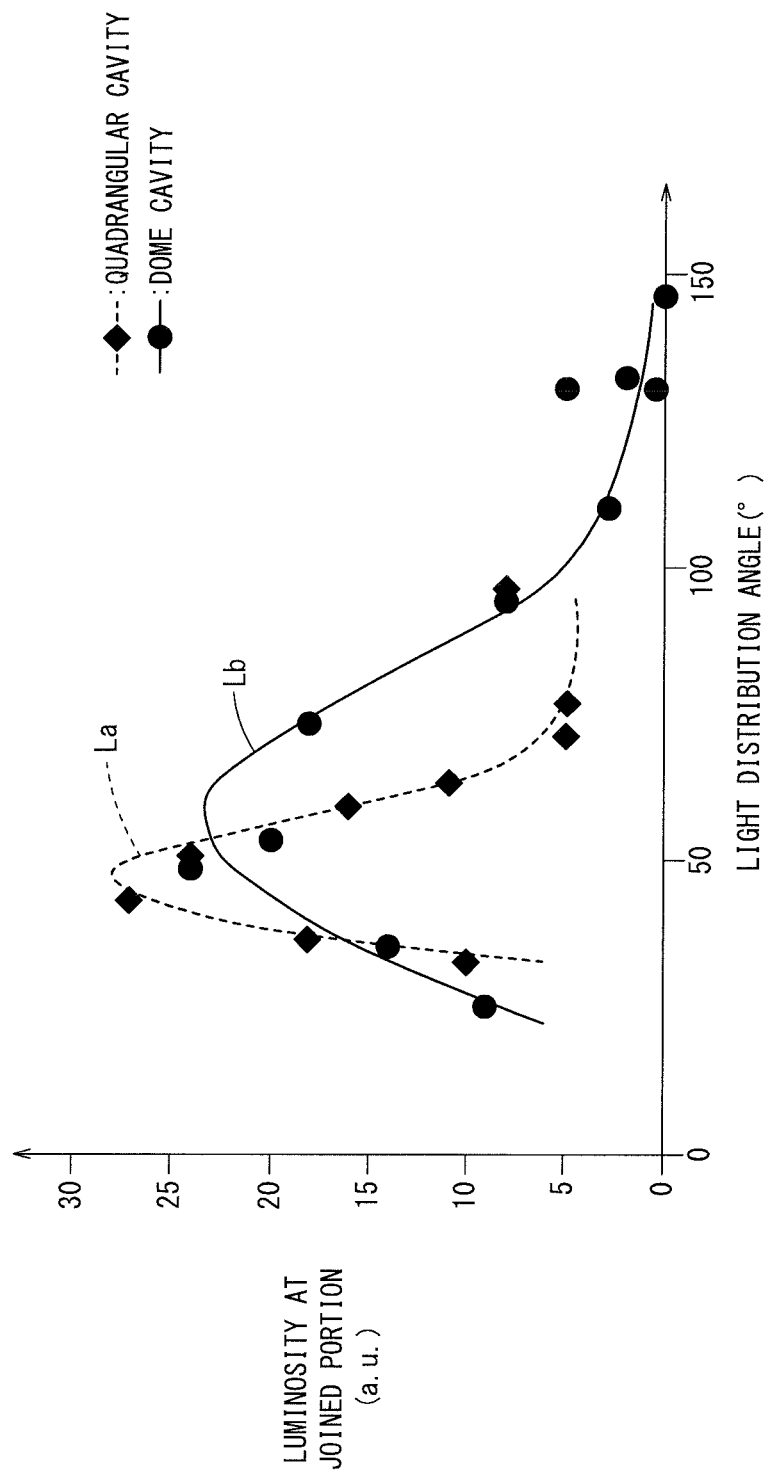
FIG. 19 is a graph showing a change in the luminosity at the joined portions with respect to the light distribution angle, in relation to Exemplary Embodiments 1 to 3 and 10 to 26.

Further, the change in the luminosity at the joined portion with respect to the light distribution angle is shown in the graph of FIG. 19. In this graph, in the case that the accommodating space is of a quadrangular shape (a quadrangular cavity), the change in the luminosity at the joined portion due to the light distribution angle is shown by the dashed line La, and in the case that the accommodating space is of a dome shape (a dome cavity), the change in the luminosity at the joined portion due to the light distribution angle is shown by the solid line Lb.

From the graph of FIG. 19, in the case that the shape of the accommodating space is a quadrangular cavity, the light distribution angle preferably lies within a range other than from 40° to 55°. In the case that the shape of the accommodating space is a dome cavity, the light distribution angle preferably lies within a range other than from 45° to 70°.

Figure 20:
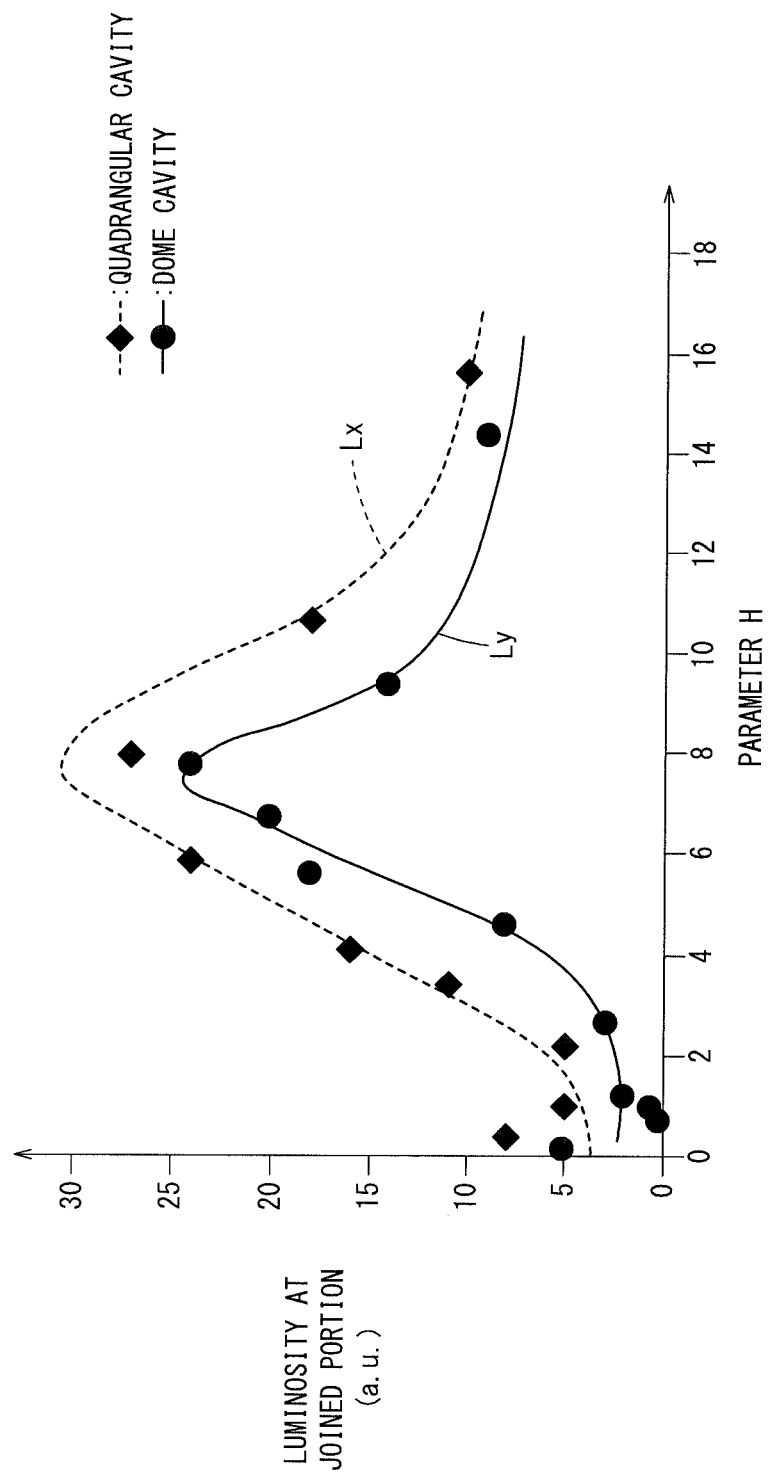
FIG. 20 is a graph showing a change in the luminosity at the joined portions with respect to the parameter H, in relation to Exemplary Embodiments 1 to 3 and 10 to 26.

Similarly, the change in the luminosity at the joined portion with respect to the parameter H is shown in the graph of FIG. 20. In the graph of FIG. 20, the change in the parameter H in the case that the shape of the accommodating space is a quadrangular shape, is shown by the dashed line Lx, whereas the change in the parameter H in the case that the shape of the accommodating space is a dome shape, is shown by the solid line Ly.

From the graph of FIG. 20, in the case that the accommodating space is of a quadrangular shape (a quadrangular cavity), the parameter H preferably lies within a range of from 0 to 5 and from 10 to 18, more preferably, lies within a range of from 0 to 5, and particularly preferably, lies within a range of from 0 to 3.

Further, in the case that the accommodating space is of a dome shape (a dome cavity), the parameter H preferably lies within a range of from 0 to 6.5 and from 8.5 to 18, more preferably, lies within a range of from 0 to 6.5, and particularly preferably, lies within a range of from 0 to 5. The dome cavity is capable of reducing the luminosity of the joined portion more effectively than the quadrangular cavity.

The above-described embodiments can be summarized in the following manner.

[1] The transparent sealing member according to the present embodiment is a transparent sealing member used in an optical component equipped with a package including at least one optical element that emits ultraviolet light, and a mounting substrate on which the optical element is mounted, the transparent sealing member comprising a transparent body joined via an organic adhesive layer formed on an upper surface of the mounting substrate, wherein the transparent body includes a concave portion which is open at a bottom thereof.

In accordance with such a configuration, it is possible to avoid a situation in which the ultraviolet light is irradiated onto the organic adhesive, and to enable an improvement in the durability of the package while using an inexpensive organic adhesive, as well as enabling an improvement in light extraction efficiency.

[2] In the present embodiment, the transparent body includes an annular pedestal fixed on the mounting substrate, and a lens body integrally formed on the pedestal. In accordance with such a configuration, at least the light extraction efficiency can be enhanced.

[3] In the present embodiment, an upper surface of the lens body has a convex lens shape. In accordance with such a configuration, the light extraction efficiency can be enhanced, together with enabling a reduction in luminosity at the joined portion.

[4] In the present embodiment, an upper surface of the lens body has a planar lens shape. In accordance with such a configuration, the light extraction efficiency can be enhanced.

[5] In the present embodiment, the lens body has a shape in which an outer peripheral portion thereof continuously expands as the outer peripheral portion separates away from the mounting substrate. In accordance with such a configuration, the light extraction efficiency can be enhanced, together with enabling a reduction in luminosity at the joined portion.

[6] In the present embodiment, the concave portion, which is open at the bottom thereof, of the transparent body forms an accommodating space for the optical element together with the upper surface of the mounting substrate. In accordance with such a configuration, it is possible to avoid a situation in which the ultraviolet light is irradiated onto the organic adhesive layer.

[7] In the present embodiment, the accommodating space has a quadrangular shape.

[8] In the present embodiment, the light distribution angle lies within a range other than from 40° to 55°. More specifically, when the shape of the accommodating space is a quadrangular shape and the light distribution angle lies within a range other than from 40° to 55°, it is possible to enhance the light extraction efficiency, together with enabling a reduction in luminosity at the joined portion.

[9] In the present embodiment, the transparent body includes an annular pedestal fixed on the mounting substrate, and a groove which is open at a bottom thereof is formed within the pedestal, on an outer side of the accommodating space. Within the ultraviolet light emitted from the optical element, ultraviolet light having a small angle of emission (ultraviolet light emitted in a lateral direction) is controlled so as to be reflected upwardly at the inclined surface of the groove. Therefore, it is possible to reduce the light that is guided to the side surface portion.

[10] In the present embodiment, the accommodating space has an upwardly convex dome shape.

[11] In the present embodiment, the light distribution angle lies within a range other than from 45° to 70°. More specifically, when the shape of the accommodating space is a dome shape and the light distribution angle lies within a range other than from 45° to 70°, it is possible to enhance the light extraction efficiency, together with enabling a reduction in luminosity at the joined portion.

[12] In the present embodiment, the upper surface of the concave portion, which is open at the bottom thereof, of the transparent body is formed in a convex shape oriented toward the mounting substrate. In accordance with such a configuration, the ultraviolet light emitted from the optical element can be controlled so as to be directed upwardly, and it is possible to reduce the light that is guided to the side surface portion.

[13] In the present embodiment, the concave portion, which is open at the bottom thereof, of the transparent body forms an accommodating space for the optical element together with the upper surface of the mounting substrate, the accommodating space has a quadrangular shape, and when a parameter H based on a height factor of the transparent body is defined by the following arithmetic expression (1), $$H = hm^3 - hk + hl \quad (1)$$

(where hm is a height of the lens body, hk is a maximum height of the accommodating space, and hl is a height of the pedestal), the parameter H lies within a range of from 0 to 5 and from 10 to 18. In accordance with such a configuration, it is possible to reduce the luminosity at the joined portion.

[14] In the present embodiment, the parameter H more preferably lies within a range of from 0 to 5.

[15] In the present embodiment, the concave portion, which is open at the bottom thereof, of the transparent body forms an accommodating space for the optical element together with the upper surface of the mounting substrate, the accommodating space has a dome shape, and when a parameter H based on a height factor of the transparent body is defined by the following arithmetic expression (2), $$H = hm^3 - hk^3 + hl \quad (2)$$

(where hm is a height of the lens body, hk is a maximum height of the accommodating space, and hl is a height of the pedestal), the parameter H lies within a range of from 0 to 6.5 and from 8.5 to 18. In accordance with such a configuration, it is possible to reduce the luminosity at the joined portion.

[16] In the present embodiment, the parameter H more preferably lies within a range of from 0 to 6.5.

[17] The optical component according to the present embodiment is an optical component comprising: at least one optical element that emits ultraviolet light; and a package in which the optical element is accommodated, wherein the package includes: a mounting substrate on which the optical element is mounted; and a transparent body joined via an organic adhesive layer formed on an upper surface of the mounting substrate, the transparent body including a concave portion which is open at a bottom thereof.

In accordance with such a configuration, it is possible to avoid a situation in which the ultraviolet light is irradiated onto the organic adhesive, and to enable an improvement in the durability of the package while using an inexpensive organic adhesive, as well as enabling an improvement in light extraction efficiency.

The transparent sealing member and the optical component according to the present invention are not limited to the above-described embodiments, and it is a matter of course that various configurations could be adopted therein without departing from the spirit and gist of the present invention.

The invention claimed is:

1. A transparent sealing member: used in an optical component equipped with a package including at least one optical element configured to emit ultraviolet light, and a mounting substrate on which the optical element is mounted, the transparent sealing member comprising:
- a transparent body joined via an organic adhesive layer formed on an upper surface of the mounting substrate,
- wherein the transparent body includes a concave portion which is open at a bottom thereof, an annular pedestal fixed on the mounting substrate; and a lens body integrally formed on the pedestal, and
- the concave portion, which is open at the bottom thereof, of the transparent body forms an accommodating space for the optical element together with the upper surface of the mounting substrate;
- the accommodating space has a quadrangular shape; and
- when a parameter H based on a height factor of the transparent body is defined by an arithmetic expression (1) below, $$H = hm^3 - hk + hl \qquad (1)$$

(where hm is a height of the lens body, hk is a maximum height of the accommodating space, and hl is a height of the pedestal),
the parameter H lies within a range of from 0 to 5 and from 10 to 18.

2. The transparent sealing member according to claim 1, wherein a light distribution angle lies within a range other than from 40° to 55°.

3. The transparent sealing member according to claim 1, wherein the parameter H lies within a range of from 0 to 5.

4. An optical component comprising the transparent sealing member according to claim 1.

5. A transparent sealing member used in an optical component equipped with a package including at least one optical element configured to emit ultraviolet light, and a mounting substrate on which the optical element is mounted, the transparent sealing member comprising:
- a transparent body joined via an organic adhesive layer formed on an upper surface of the mounting substrate,
- wherein the transparent body includes a concave portion which is open at a bottom thereof, an annular pedestal fixed on the mounting substrate; and a lens body integrally formed on the pedestal, and
- the concave portion, which is open at the bottom thereof, of the transparent body forms an accommodating space for the optical element together with the upper surface of the mounting substrate;
- the accommodating space has a dome shape; and
- when a parameter H based on a height factor of the transparent body is defined by an arithmetic expression (2) below, $$H = hm^3 - hk^3 + hl \qquad (2)$$

(where hm is a height of the lens body, hk is a maximum height of the accommodating space, and hl is a height of the pedestal),
the parameter H lies within a range of from 0 to 6.5 and from 8.5 to 18.

6. The transparent sealing member according to claim 5, wherein a light distribution angle lies within a range other than from 45° to 70°.

7. The transparent sealing member according to claim 5, wherein the parameter H lies within a range of from 0 to 6.5.

8. An optical component comprising the transparent sealing member according to claim 5.

* * * * *